(12) United States Patent
Duncan et al.

(10) Patent No.: US 12,238,894 B2
(45) Date of Patent: Feb. 25, 2025

(54) ARCHITECTURE TO PROVIDE LIQUID AND CLOSED LOOP AIR COOLING

(71) Applicant: Dell Products L.P., Round Rock, TX (US)

(72) Inventors: Tyler Baxter Duncan, Austin, TX (US); Anthony Middleton, Cedar Park, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 0 days.

(21) Appl. No.: 18/633,906

(22) Filed: Apr. 12, 2024

(65) Prior Publication Data
US 2024/0268070 A1  Aug. 8, 2024

Related U.S. Application Data

(62) Division of application No. 17/971,332, filed on Oct. 21, 2022, now Pat. No. 12,004,326.

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ......... *H05K 7/20327* (2013.01); *H05K 7/208* (2013.01)

(58) Field of Classification Search
CPC ........... H05K 7/20327; H05K 7/20336; H05K 7/20381; H05K 7/20318; H05K 7/20309; H05K 7/2029; H05K 7/208; H05K 7/20809; H05K 7/20818; H05K 7/20827; H05K 7/20836
See application file for complete search history.

(56) References Cited

U.S. PATENT DOCUMENTS

| | | | |
|---|---|---|---|
| 6,213,200 B1 | 4/2001 | Carter et al. | |
| 7,757,506 B2* | 7/2010 | Ellsworth, Jr. | .... H05K 7/20772 62/332 |
| 7,963,119 B2* | 6/2011 | Campbell | ................. G06F 1/20 165/104.33 |
| 8,351,200 B2* | 1/2013 | Arimilli | ............. H05K 7/20745 165/80.4 |

(Continued)

*Primary Examiner* — Anthony M Haughton
(74) *Attorney, Agent, or Firm* — Aly Z. Dossa; DELL PRODUCTS L.P.

(57) ABSTRACT

A method for cooling one or more Information Technology (IT) units, the method comprising adjusting a first valve controlling liquid flow in a primary loop, wherein the primary loop comprises: at least one dry cooler of a dry cooling section, and an air/liquid exchange section comprising at least one air/liquid exchange device that provides air cooling to the one or more IT units. The method further comprising adjusting a second valve controlling liquid flow into a liquid loop interface, the liquid loop interface being connected to a secondary loop, the secondary loop comprising the one or more IT units; and at least one liquid heat exchange device of the liquid loop interface that provides liquid cooling to the one or more IT units, and wherein adjusting the first and second valves controls the ratio of liquid cooling to air cooling to the one or more IT units.

10 Claims, 5 Drawing Sheets

(56) References Cited

U.S. PATENT DOCUMENTS

| | | | |
|---|---|---|---|
| 8,395,896 B2* | 3/2013 | Belady | H05K 7/2079 |
| | | | 361/698 |
| 9,320,177 B2 | 4/2016 | Levesque | |
| 9,494,371 B2* | 11/2016 | Werner | F28F 7/00 |
| 11,457,547 B1 | 9/2022 | Gao | |
| 2016/0120059 A1 | 4/2016 | Shedd et al. | |
| 2017/0248035 A1* | 8/2017 | Manglik | F28D 20/025 |
| 2018/0324976 A1 | 11/2018 | Gao et al. | |
| 2019/0320548 A1 | 10/2019 | Gao | |
| 2021/0068300 A1* | 3/2021 | Chehade | H05K 7/20263 |
| 2021/0185859 A1 | 6/2021 | Gao | |
| 2021/0368647 A1 | 11/2021 | Boucher et al. | |
| 2022/0390178 A1* | 12/2022 | Hnayno | F28F 27/00 |
| 2023/0200025 A1 | 6/2023 | Gao | |

* cited by examiner

ARCHITECTURE TO PROVIDE LIQUID AND CLOSED LOOP AIR COOLING

CROSS REFERENCE TO RELATED APPLICATIONS

This is a divisional of U.S. patent application Ser. No. 17/971,332, filed Oct. 21, 2022. U.S. patent application Ser. No. 17/971,332 is hereby incorporated by reference in their entirety.

BACKGROUND

The heterogeneous Information Technology (IT) environments witnessed today often require a mixture of air and liquid cooling. With various technologies prevalent in the liquid cooling space, custom solutions, such as using commercially available industrial heating, ventilation and air conditioning (HVAC) units, are often sized and developed per application load and/or targeted toward a specific supply medium. The custom solutions may require additional custom engineering for each deployment and/or refresh cycle of the IT.

In addition, the ratio of liquid cooling to air cooling often varies greatly from one system to another. Mixed environments that utilize liquid cooled and air cooled racks typically result in custom engineering for each solution. Also, mixed environments may result in an un-optimized cooling solution that leaves capacity, or is short on capacity, either in the liquid or the air cooling side. This problem may be amplified as IT is refreshed by the constant manual tuning of the cooling system that may be required. Further, in mixed environments, the presence of personnel may affect the air temperatures, resulting in temperatures that are detrimental to the IT and/or not safe for the personnel.

SUMMARY

In one aspect, embodiments described herein relate to a system for cooling IT units that includes a dry cooling section with at least one dry cooler and a liquid loop interface with at least one liquid heat exchange device. The system includes a primary loop with at least one dry cooler of the dry cooler section, and a secondary loop with the at least one liquid heat exchange device of the liquid loop interface that provides liquid cooling to one or more IT units.

In another aspect, embodiments described herein relate to a method for cooling IT units that includes adjusting a first valve controlling liquid flow in a primary loop, the primary loop including at least one dry cooler of a dry cooling section and an air/liquid exchange section with at least one air/liquid exchange device that provides air cooling to the one or more IT units. The method also includes adjusting a second valve controlling liquid flow into a liquid loop interface, the liquid loop interface being connected to a secondary loop that includes the one or more IT units and at least one liquid heat exchange device of the liquid loop interface. The method adjusts the first and second valves to control the ratio of liquid cooling to air cooling to the one or more IT units.

In another aspect, embodiments described herein relate to a method for cooling a system that includes detecting the presence of a user in a space of the cooling system and adjusting a first valve controlling liquid flow in a primary loop. The primary loop includes at least one dry cooler of a dry cooling section and an air/liquid exchange section comprising at least one air/liquid exchange device that provides air cooling to one or more IT units. The method adjusts the first valve to increase the liquid flow rate to the air/liquid exchange section.

BRIEF DESCRIPTION OF DRAWINGS

Certain embodiments of the technology will be described with reference to the accompanying drawings. However, the accompanying drawings illustrate only certain aspects or implementations of the technology by way of example and are not meant to limit the scope of the claims.

DETAILED DESCRIPTION

Figure 1:
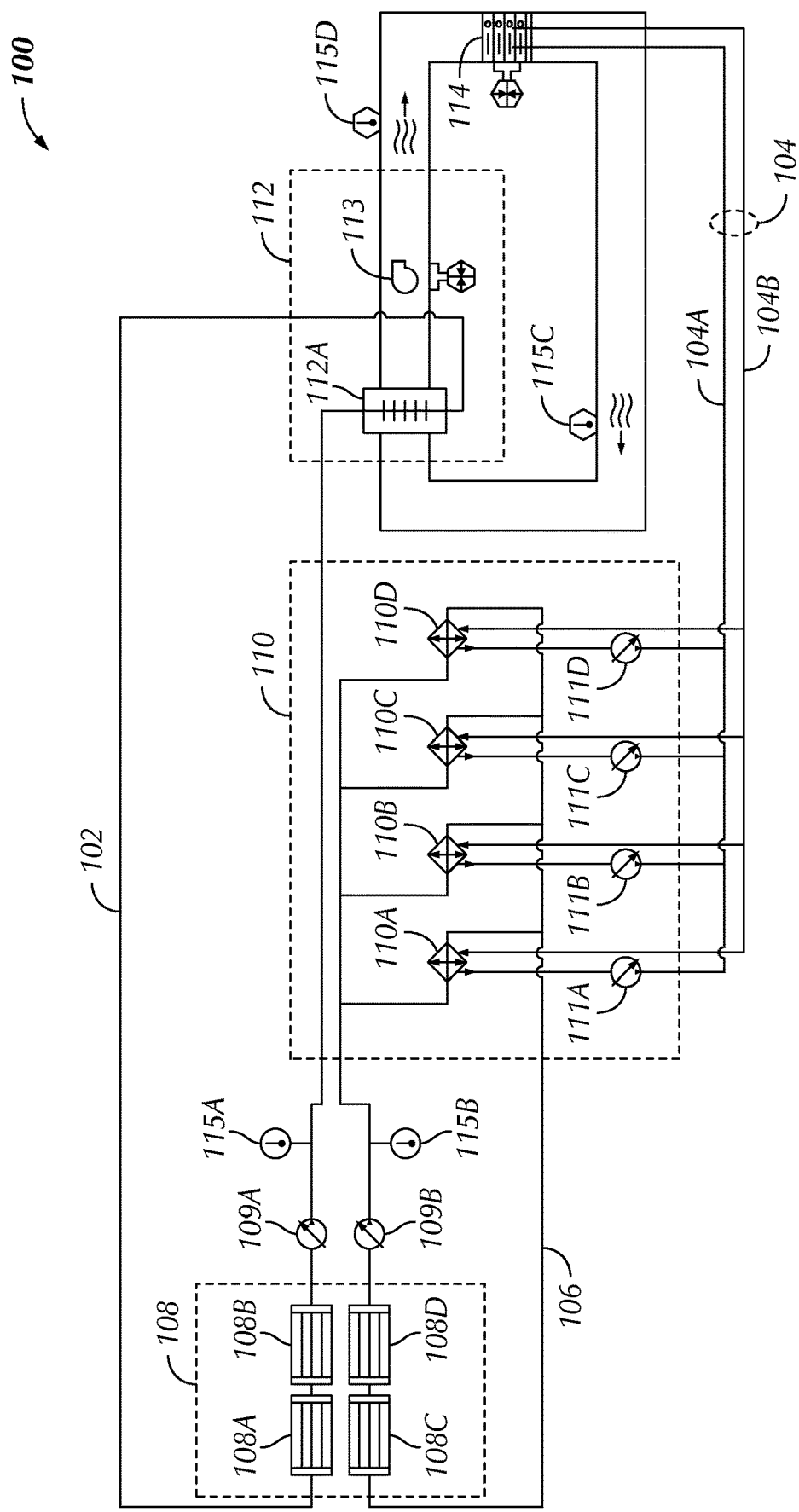
FIG. 1 shows a diagram of a multi-loop system in accordance with one or more embodiments of the technology.

Specific embodiments will now be described with reference to the accompanying figures. In the following description, numerous details are set forth as examples of the technology. It will be understood by those skilled in the art that one or more embodiments of the present technology may be practiced without these specific details and that numerous variations or modifications may be possible without departing from the scope of the technology. Certain details known to those of ordinary skill in the art are omitted to avoid obscuring the description.

In the following description of the figures, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment, which may be implemented in addition to, in conjunction with, or in place of the embodiments described with regard to a corresponding like-named component in any other figure.

In general, embodiments disclosed herein are directed to cooling solutions in an IT environment using cooling modules. In this context, IT refers to racks, servers, storage, networking components, and/or any other equipment that may benefit from liquid and/or air cooling.

Embodiments of the cooling solutions include cooling modules that may have all the required power transformation and controls for operation and operate autonomously. Such cooling modules may be assembled with the IT (e.g., in an IT module) at the factory and delivered to the site as a single unit, or the cooling modules may be assembled at a factory, transported to the customer site, and then connected to an IT system at a customer site as part of a site assembled solution.

Embodiments disclosed herein use multiple closed liquid cooling loops to establish the liquid cooling. Embodiments may utilize one or more compressor-less dry coolers in a primary loop. Optionally, the dry coolers may use evaporative cooling for heat rejection to an outside environment. Embodiments of the cooling loops also include liquid heat exchange devices (also referred to as coolant distribution units (CDUs)). The cooling liquid provided by the dry coolers may be used to remove the heat from the CDUs. The CDUs may be a part of a secondary cooling loop to provide direct liquid cooling to the IT.

Embodiments may also include air-liquid heat exchange devices to provide the desired air cooling. An air-liquid heat exchange device may be included in either the primary or secondary cooling loops.

In some embodiments, flow control valves may be used to control the ratio of liquid cooling to air cooling. In such embodiments, the ratio of cooling from the liquid heat exchange devices to the cooling using air/liquid exchange devices may be engineered to specific demands and/or environments. Embodiments disclosed herein also include safety measures that may be undertaken to ensure personnel safety when servicing such cooling systems.

FIG. 1 shows a diagram of a multi-loop system in accordance with one or more embodiments disclosed herein. The multi-loop system (100) includes a primary loop (102), a secondary loop (104), and a third loop (106).

The multi-loop system (100) includes a dry cooling section (108), a liquid loop interface (110), and an air/liquid exchange section (112) to provide the cooling to the IT (114). Each of these components and/or sections is described below.

In one or more embodiments, the dry cooling section (108) includes one or more dry coolers (108A-108D). The number of dry coolers is not limited, and may be selected based on the cooling requirements and environment (i.e., geography, available space, etc.) The dry coolers are compressor-less coolers and/or evaporative coolers. The dry coolers may use an adiabatic process for cooling a liquid. The dry cooling section (108) includes monitoring and control components, for example dry cooling pumps (109A, 109B) and temperature monitors (115A, 115B).

In FIG. 1, the liquid loop interface (110) is an interface between the secondary loop (104) and the third loop (106). The liquid loop interface (110) includes one or more CDUs (110A-110D). One of ordinary skill in the art will appreciate that the number of CDUs in the liquid loop interface (110) is not limited. The number of CDUs may be selected based on the cooling requirements of the IT, in conjunction with the number of dry coolers.

In these embodiments, the CDUs (110A-110D) provide liquid cooling to the IT (114) via the secondary loop (104). The third loop (106) provides liquid cooling to the CDUs (110A-110D) using dry coolers (108C, 108D) of the dry cooling section (108). For each CDU (110A-110D), a CDU pump (111A-111D) is provided to control the flow in secondary loop (104).

The primary loop (102) provides liquid cooling to the air/liquid exchange section (112). The cooled fluid from the dry cooling section (108) is used to remove heat from the air via an air to liquid heat exchange device (112A). One or more fans (113) may be used to direct the flow of air to and from the IT (114). One or more temperature sensors (115C, 115D) may be used to monitor the air temperature and air cooling conditions in the air/liquid exchange section (112). The sensors may then be used, e.g., to control the operation of the one or more fans (113).

In the example of FIG. 1, the primary loop (102) includes two dry coolers (108A, 108B) of the dry cooling section (108) and the air to liquid heat exchange device (112A) of the air/liquid exchange section (112). The secondary loop (104) is the closed liquid loop that includes the CDUs (110A-110D) of the liquid loop interface (110) and the IT (114). The third loop (106) includes two dry coolers (108C, 108D) of the dry cooling section (108) and the CDUs (110A-110D) of the liquid loop interface (110).

In these examples, the primary loop (102) and third loop (106) follow separate paths through the dry cooling section (108). The dry cooling section (108) includes four dry coolers (108A-108D), and the loops are connected such that the primary loop (102) utilizes two of the dry coolers (108A, 108B) and the third loop (106) utilizes the remaining dry coolers (108C, 108D). However, as will be demonstrated below, embodiments disclosed herein are not limited to the number of loops utilizing the dry cooling section (108).

Embodiments of FIG. 1 demonstrate a scalable closed loop cooling solution that includes a primary liquid loop with compressor-less dry coolers that may include an evaporative cooling option for heat rejection to the outside environment, a secondary liquid loop to remove heat from the liquid cooled IT, and an air to liquid heat exchange device to remove heat from the air that provides air cooling to the IT in a single packaged cooling unit. The use of the dry coolers provides an energy efficient removal of heat for both liquid and air cooling sections. However, one of ordinary skill in the art will appreciate that the dry coolers may be replaced with mechanical cooling if lower liquid temperatures are required.

In embodiments disclosed herein, the liquid used in the cooling loops is not limited to any particular fluid. For example, distilled water, glycol solutions (e.g., ethylene glycol, propylene glycol) and mixtures thereof may be used in the cooling loops. Further, different fluids may be used in different cooling loops. For example, the primary loop (also referred to as primary liquid cooling loop) may use distilled water, while the secondary cooling loop uses a water/glycol mixture.

Those skilled in the art will appreciate that while FIG. 1 has been described as including specific numbers of various components, embodiments of technology are not limited to these specific quantities of components; rather, the technology may be implemented using any quantity of the various types of components.

Figure 2:
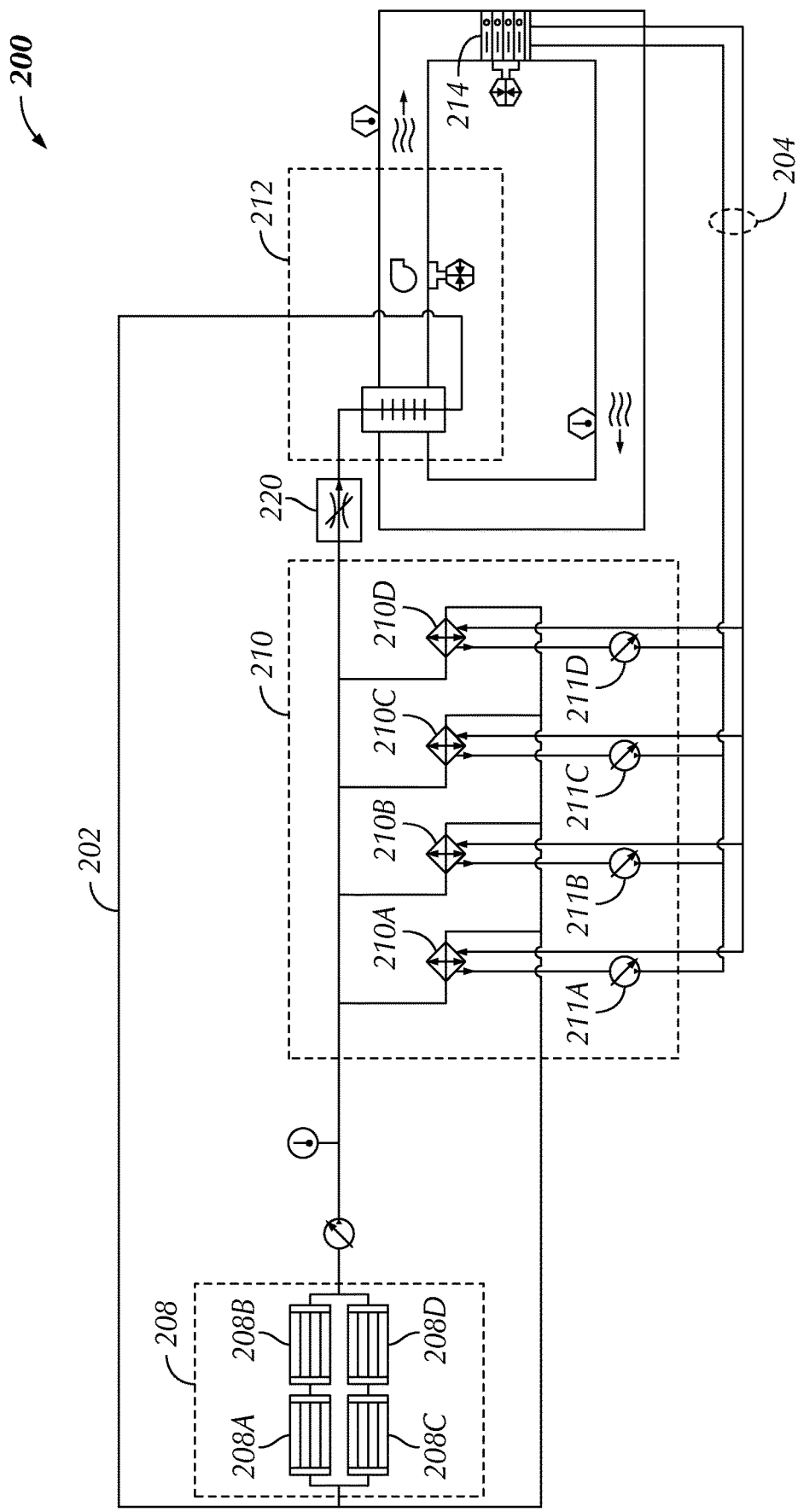
FIG. 2 shows a diagram of a dual loop system in accordance with one or more embodiments of the technology.

FIG. 2 shows a diagram of a dual loop system in accordance with one or more embodiments of the technology. The examples of the dual loop system (200) of FIG. 2 include a dry cooling section (208), a liquid loop interface (210), and an air/liquid exchange section (212) to provide the cooling to the IT (214), similar to the embodiment of FIG. 1.

In FIG. 2, the primary loop (202) includes the dry cooling section (208), the liquid loop interface (210), and the air/liquid exchange section (212). The secondary loop (204) is a closed liquid loop that includes the CDUs (210A-210D) of the liquid loop interface (210) and the IT (214). In FIG. 2, a flow control valve (220) controls the liquid flow in the primary loop (202).

In FIG. 2, the dry cooling section (208) includes four dry coolers (208A-208D) with two dry coolers (208A, 208B) being connected in parallel with the remaining dry coolers (208C, 208D). However, one of ordinary skill in the art will appreciate that the number and arrangement of the dry coolers is not limited.

In embodiments of FIG. 2, the flow control valve (220) may include an air temperature input from the air/liquid exchange section (212) to control the flow of liquid in the primary loop (202). In such embodiments, the flow control valve (220) of the primary liquid loop (202) may engineer the pressure and/or flow, in conjunction with the speed of the CDU pumps (211A-211D), to establish the desired air and liquid cooling.

Those skilled in the art will appreciate that while FIG. 2 has been described as including specific numbers of various components, embodiments of technology are not limited to these specific quantities of components; rather, the technology may be implemented using any quantity of the various types of components.

Figure 3:
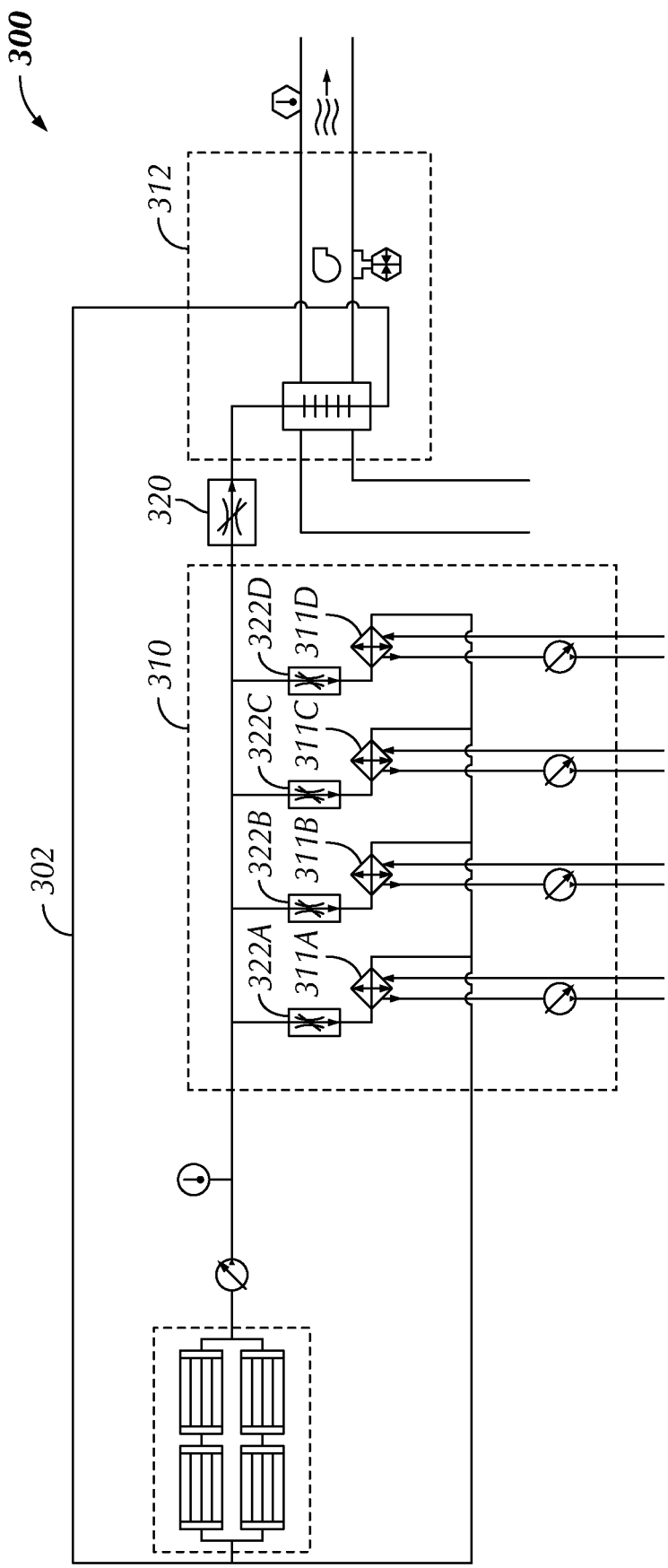
FIG. 3 shows a diagram of a system for adjusting the liquid/air cooling ratio in accordance with one or more embodiments of the technology.

FIG. 3 shows a diagram of a system for adjusting the liquid/air cooling ratio in accordance with one or more embodiments of the technology. The examples demonstrated by the system (300) of FIG. 3 is similar to that of FIG. 2, with the addition of CDU flow control valves (322A-322D) associated with the CDUs (310A-310D) in the primary loop (302). In the embodiment shown in FIG. 3, the number of CDU flow control valves (322A-322D) is shown as equal to the number of CDUs (310A-310D); however, embodiments are not limited as such. For example, one CDU control valve may service one or more CDUs in accordance with embodiments disclosed herein.

The flow control valves (320, 322A-322D) may be used to control the ratio of liquid cooling, via the secondary loop, to the air cooling provided by the air/liquid exchange section (312), via the primary loop. Such embodiments provide direct control of the amount of cooling provided by the liquid cooling and the amount of cooling provided by the air side cooling. Embodiments may include an air temperature input from the air/liquid exchange section (312) to direct the flow of liquid in the primary loop (302) using the flow control valve (320). Embodiments may also use temperature monitoring in the CDUs (310A-310D), in conjunction with the CDU pumps (311A-311D), to control the cooling in the secondary loop via the CDU control valves (322A-322D).

Those skilled in the art will appreciate that while FIG. 3 has been described as including specific numbers of various components, embodiments of technology are not limited to these specific quantities of components; rather, the technology may be implemented using any quantity of the various types of components.

Figure 4:
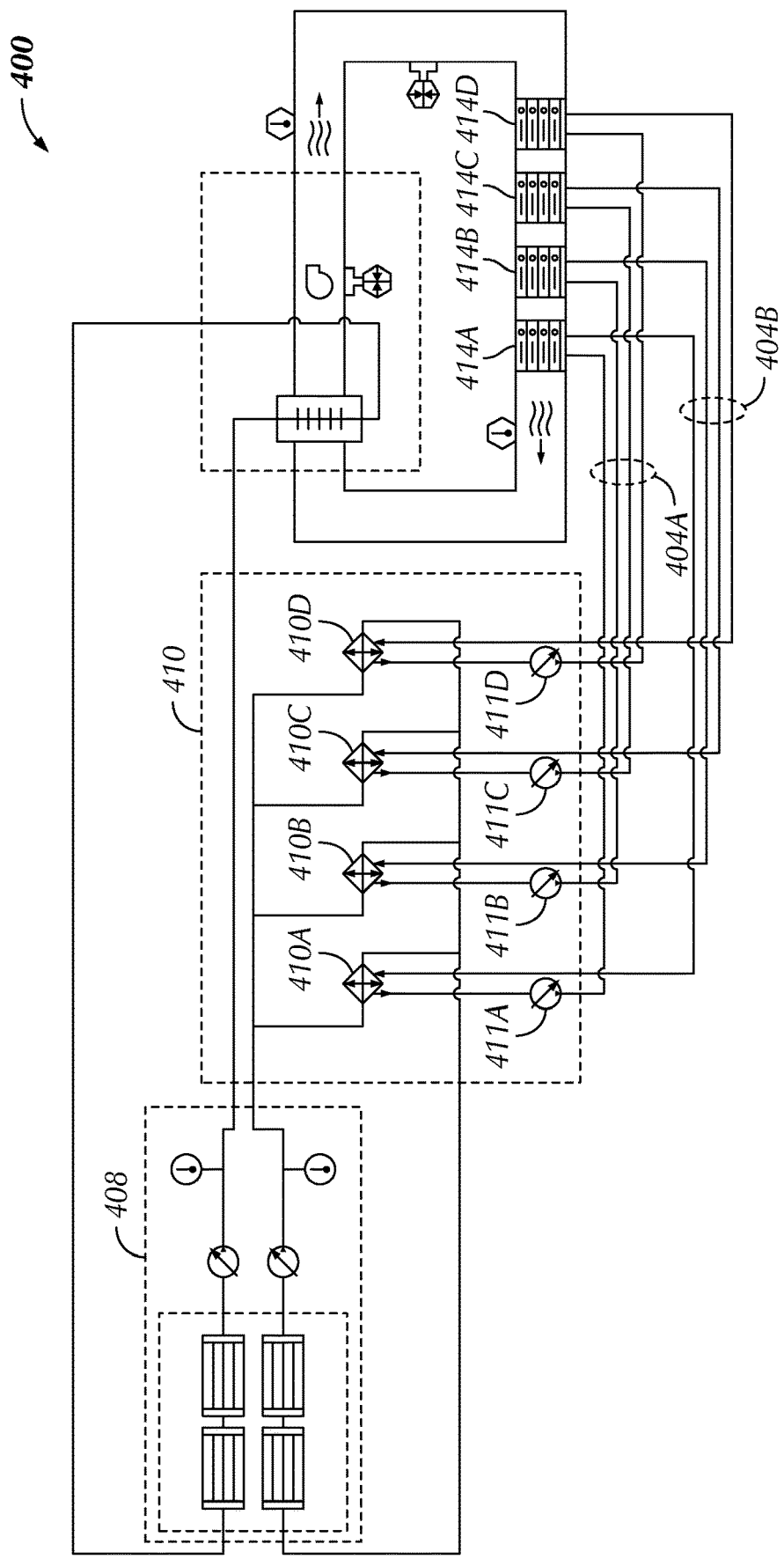
FIG. 4 shows a diagram of a multicomponent system in accordance with one or more embodiments of the technology.

FIG. 4 shows a diagram of a multicomponent system in accordance with one or more embodiments of the technology. The system (400) of FIG. 4 demonstrates that the secondary loop (404) may include multiple IT units (414A-414D). As shown in FIG. 4, the cool side of the secondary loop (404A) follows a path from the CDUs (410A-410D) to the IT units (414A-414D), and the hot side of the secondary path (404B) follows a path from the IT units (414A-414D) back to the CDUs (410A-410D).

In FIG. 4, the number of CDUs is shown with an equal number of IT units; however, embodiments disclosed herein are not limited as such. One of ordinary skill in the art will appreciate that one CDU may service one or more IT units, or more than one CDU may service a single IT unit. The CDU pumps (411A-411D) may be used to control the flow in the secondary loop (404) in accordance with the number and/or type of IT units (414A-414D) serviced by each of the CDUs (410A-410D). Further control may be established using CDU control valves as described in FIG. 2-3 in accordance with embodiments disclosed herein.

Those skilled in the art will appreciate that while FIG. 4 has been described as including specific numbers of various components, embodiments of technology are not limited to these specific quantities of components; rather, the technology may be implemented using any quantity of the various types of components.

The use of dry coolers and multi-loop configurations disclosed herein provide efficient scalable cooling systems. Embodiments disclosed herein have the effect of a Power Usage Effectiveness (PUE) near 1.0. In this context, the PUE refers to the ratio of total power to the IT power required. As such, the most efficient PUE is a value of 1.0, while less efficient systems exhibit a PUE of greater than 1.0. The PUE of conventional systems is typically above 1.5. Embodiments disclosed herein have a PUE may have a PUE less than 1.3. Some embodiments disclosed herein may exhibit a PUE less than 1.1. Embodiments disclosed herein may exhibit a PUE of 1.01-1.05.

Figure 5:
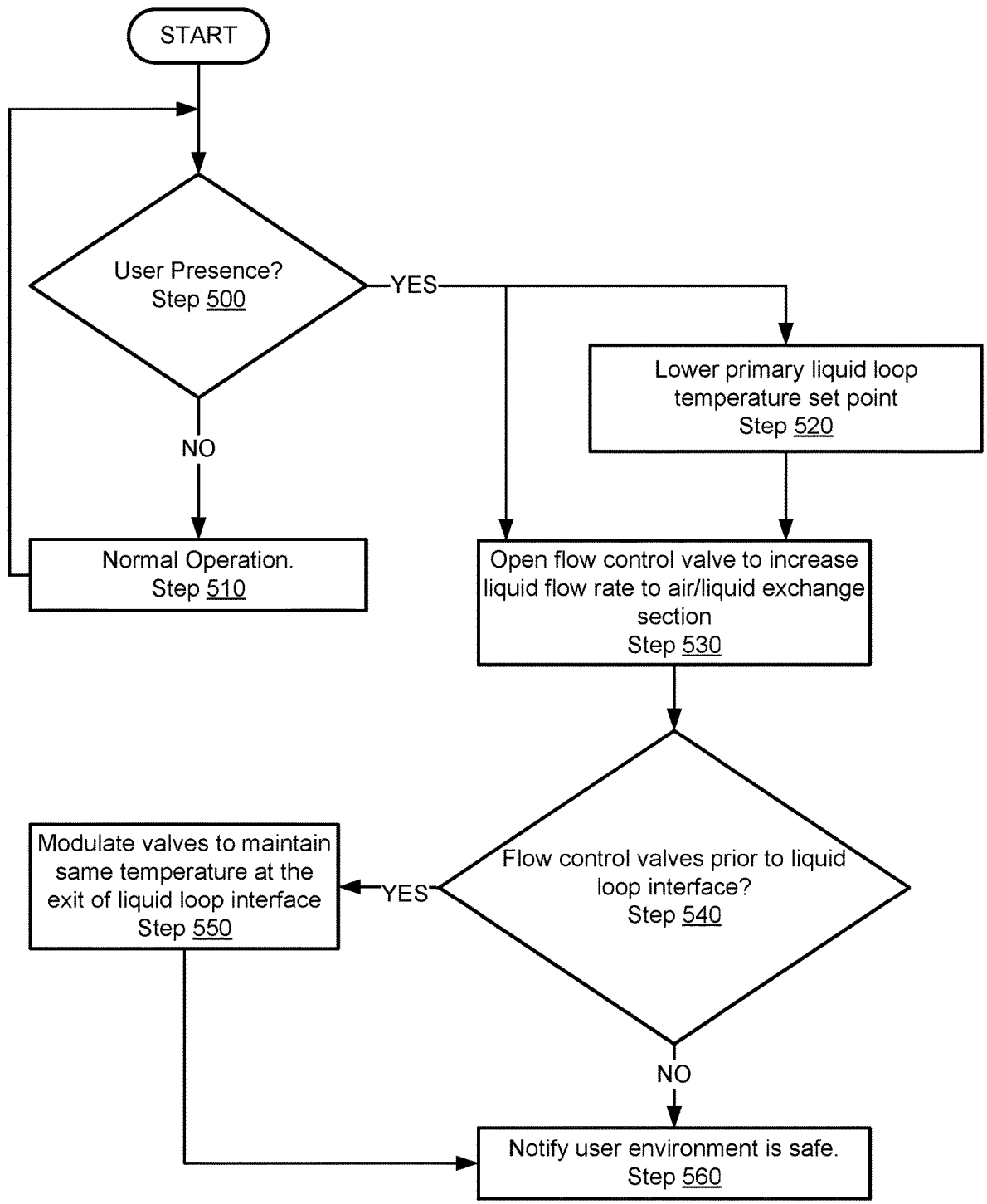
FIG. 5 shows a flow chart for maintenance in accordance with one or more embodiments of the technology.

One of ordinary skill in the art will appreciate that accessing cooling equipment and facilities for maintaining and servicing may lead to higher temperatures detrimental to the operations of IT units. To that end, FIG. 5 demonstrates a flow chart for maintenance in accordance with one or more embodiments of the technology. Embodiments of FIG. 5 allow for the servicing and/or maintenance of systems with minimal interruption of the operation. More specifically, embodiments of FIG. 5 may allow for a decrease in the air temperature to within an acceptable range for maintenance without impacting the secondary loop temperature to the IT. Said another way, the portions of the IT system that a user may need to access is controlled by the secondary loop. To make it safe for the user to access the aforementioned portions of the IT system, the temperature in the secondary loop needs to be temporarily raised while the user is accessing the portion of the IT system. To compensate for this increase in temperature in the secondary loop, the temperature in the primary loop is decreased. In this manner, the IT may continue to operate within an acceptable temperature range, while also providing the user with safe access to the aforementioned portions of the IT system. Once the user has completed their work, the temperatures in the primary and secondary loops may revert back to the state they were in prior to the user attempting to access.

In Step 500, a user presence is detected. Such detection may be achieved through automatic means, such as by cameras/sensors that detect personnel and/or sensors on facility access points. The detection may also be achieved by the user indicating a desire to enter the environment, such as a switch and/or command entry. If no user presence is detected (NO in Step 500), normal operation is resumed in Step 510. In some embodiments, the system may continuously monitor for the presence of individuals. If a user presence is detected (YES in Step 500), different steps may be taken to ensure the cooling process remains functional.

In Step 520, the temperature in the primary loop may be lowered to a set point. The temperature in the primary loop may be set using the functionality of the dry coolers. By lowering the temperature in the primary loop, the liquid loop interface may compensate for heat losses due to the presence of the user.

In Step 530, the flow control valve in the primary loop may be opened to increase the liquid flow rate to the air/liquid exchange section. Increasing the flow rate in the primary loop may compensate for any temperature changes as a result of the presence of a user.

In Step 540, it is determined if there are any flow control valves prior to the liquid loop interface. If there are flow control valves present (YES in Step 540) the valves may be modulated to maintain the same temperature at the exit of the liquid loop interface in Step 550. Although not explicitly shown in FIG. 5, one or more CDU pumps also may be manipulated to help prepare the system for the presence of a user.

As illustrated, Steps 520, 530, and 540 may be used individually or combined, depending the specific configurations used in the cooling system. At the conclusion of one or more of these steps, the user is notified that the environment is prepared for access in Step 560.

Embodiments disclosed herein provide an efficient, multi-loop cooling system. The use of different sections (i.e., the dry cooling section, liquid interface, and air/liquid exchange section) allows for scaling each individual section to an appropriate size/configuration in order to accommodate the many different heterogeneous IT environments in use today. Further, the use of dry coolers in a primary loop provides for a PUE that may be less than 1.1.

While the technology has been described above with respect to a limited number of embodiments, those skilled in the art, having the benefit of this disclosure, will appreciate that other embodiments can be devised which do not depart from the scope of the technology as disclosed herein. Accordingly, the scope of the technology should be limited only by the attached claims.

What is claimed is:

1. A method for cooling one or more Information Technology (IT) units, the method comprising:
adjusting a first valve controlling liquid flow in a primary loop, wherein the primary loop comprises:
at least one dry cooler of a dry cooling section; and
an air/liquid exchange section comprising at least one air/liquid exchange device that provides air cooling to the one or more IT units;
adjusting a second valve controlling liquid flow into a liquid loop interface, the liquid loop interface being connected to a secondary loop, the secondary loop comprising:
the one or more IT units; and
at least one liquid heat exchange device of the liquid loop interface that provides liquid cooling to the one or more IT units,
wherein adjusting the first and second valves controls the ratio of liquid cooling to air cooling to the one or more IT units.

2. The method of claim 1, wherein the primary loop comprises the second valve and heat is removed from the liquid loop interface via the primary loop.

3. The method of claim 2, further comprising:
adjusting a plurality of second valves, wherein each of the plurality of second valves adjusts the flow of liquid into a plurality of liquid heat exchange devices of the liquid loop interface.

4. The method of claim 2, wherein the plurality of liquid heat exchange devices provides the secondary loop to a plurality of the IT units.

5. A method for a cooling system, the method comprising:
detecting the presence of a user in a space comprising the cooling system;
in response to the detecting, adjusting a first valve controlling liquid flow in a primary loop, wherein the primary loop comprises:
at least one dry cooler of a dry cooling section; and
an air/liquid exchange section comprising at least one air/liquid exchange device that provides air cooling to one or more IT units,
wherein adjusting the first valve comprises increasing a liquid flow rate to the air/liquid exchange section.

6. The method of claim 5, further comprising:
lowering a temperature set point of liquid in the primary loop.

7. The method of claim 6, further comprising:
after lowering the temperature set point of liquid in the primary loop, no longer detecting the presence of the user in the space comprising the cooling system;
raising the temperature set point of the liquid in the primary loop after no longer detecting the presence of the user in the space comprising the cooling system.

8. The method of claim 5, further comprising:
determining the presence of one or more second valves controlling liquid flow into a liquid loop interface, the liquid loop interface being connected to a secondary loop, the secondary loop comprising:
the one or more IT units; and
at least one liquid heat exchange device of the liquid loop interface that provides liquid cooling to the one or more IT units;
adjusting the one or more second valves to maintain a same temperature of a liquid flowing into and out of the liquid loop interface via the primary loop.

9. The method of claim 7, wherein the primary loop comprises the second valve, and heat is removed from the liquid loop interface via the primary loop.

10. The method of claim 5, wherein the user is detected by an automatic means.

* * * * *